(12) United States Patent
Jung et al.

(10) Patent No.: US 6,322,948 B1
(45) Date of Patent: Nov. 27, 2001

(54) PHOTORESIST CROSS-LINKER AND PHOTORESIST COMPOSITION COMPRISING THE SAME

(75) Inventors: Jae Chang Jung, Kyoungki-do; Keun Kyu Kong, Kwangju; Jin Soo Kim, Daejeon; Ki Ho Baik, Kyoungki-do, all of (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/499,231

(22) Filed: Feb. 7, 2000

(30) Foreign Application Priority Data

Feb. 10, 1999 (KR) .................................................. 99-4593

(51) Int. Cl.$^7$ .................................................. G03F 7/004
(52) U.S. Cl. ...................... 430/270.1; 430/927; 526/271; 526/281
(58) Field of Search ................. 430/270.1, 927; 526/281, 271

(56) References Cited

U.S. PATENT DOCUMENTS 4,808,638 * 2/1989 Steinkraus et al. ..................... 522/24
6,136,499 * 10/2000 Goodall et al. ................... 430/270.1

OTHER PUBLICATIONS

Caplus abstract of Inokuchi, T. et al. J.Org. Chem. 55(12), 1990, 3958–61.*
Chemical Formulas of registry numbers 127233–45–8 and 127233–44–7.*

* cited by examiner

Primary Examiner—Rosemary Ashton

(74) Attorney, Agent, or Firm—Townsend and Townsend and Crew LLP

(57) ABSTRACT

The present invention is directed to photoresist cross-linkers selected from the group consisting of a cross-linker monomer represented by following Chemical Formula 1, and homopolymers and copolymers thereof. Such cross-linkers are suitable for use in photolithography processes employing KrF (248 nm), ArF (193 nm), E-beam, ion-beam or EUV light sources.

<Chemical Formula 1>

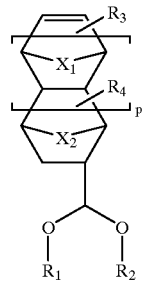

10 Claims, 5 Drawing Sheets

PHOTORESIST CROSS-LINKER AND PHOTORESIST COMPOSITION COMPRISING THE SAME

FIELD OF THE INVENTION

The present invention relates to cross-linking agents ("cross-linkers") usable for negative photoresist compositions and photoresist compositions comprising the same. More specifically, it relates to cross-linking agents used in photoresists suitable for photolithography processes using a KrF (248 nm), ArF (193 nm), E-beam, ion beam or EUV light source when preparing a microcircuit of a highly integrated semiconductor element, and photoresist compositions employing the same.

BACKGROUND OF THE INVENTION

Recently, chemical amplification type DUV (deep ultra violet) photoresists have proven to be useful to achieve high sensitivity in processes for preparing microcircuits in the manufacture of semiconductors. These photoresists are prepared by blending a photoacid generator with polymer matrix macromolecules having acid labile structures.

According to the reaction mechanism of such a negative photoresist, the photoacid generator generates acid when it is irradiated by the light source, and the main chain or branched chain of the polymer matrix macromolecule is cross-linked with the generated acid to form a cross-linked structure. Thus, the portion exposed to light cannot be dissolved by developing solution and remains unchanged, thereby producing a negative image of a mask on the substrate. In the lithography process, resolution depends upon the wavelength of the light source - the shorter the wavelength, the smaller the pattern that can be formed. However, when the wavelength of the light source is decreased in order to form a micro pattern [for example, in the case of using 193 nm wavelength or EUV (extremely ultraviolet) light], it is disadvantageous in that the lens of the exposing device is deformed by the light source, thereby shortening its life.

Melamine, a conventional cross-linker, has a limited number (three) of functional groups which can form a cross-linkage with acid. Further, a large amount of acid must be generated when melamine is used as a cross-linker, because acid is consumed by the cross-linking reaction. As a result, high-energy light exposure is required for such cross-linking agents.

In order to overcome the disadvantages described above, chemical amplification type compounds that cross-link with a photoresist polymer (also referred to herein as a "photoresist resin") and use less amounts of energy are desirable. However, such chemical amplification type cross-linkers have not yet been developed.

SUMMARY OF THE INVENTION

The object of the present invention is to provide novel photoresist cross-linkers, and a process for the preparation thereof.

Another object of the present invention is to provide photoresist compositions comprising the cross-linkers, and a process for the preparation thereof.

Still another object of the present invention is to provide a semiconductor element manufactured from the photoresist composition.

DETAILED DESCRIPTION OF THE PRESENT INVENTION

Figure 1:
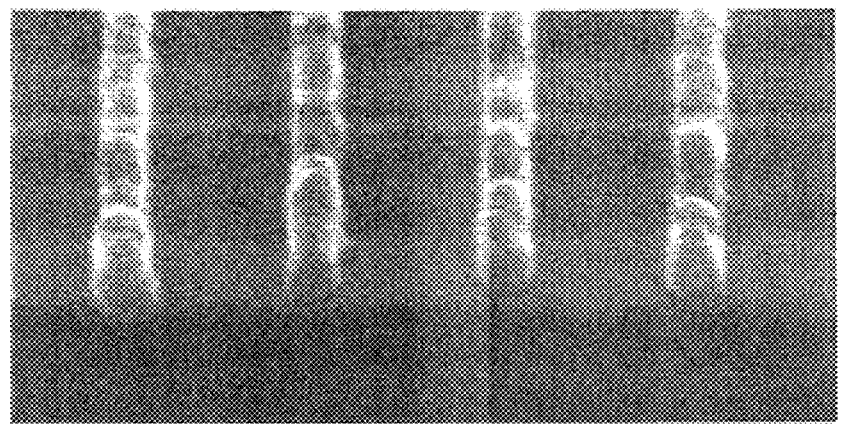
FIG. 1 to FIG. 10 show photoresist patterns prepared by using cross-linkers obtained from Examples 11 to 20.

In one aspect, the present invention provides a cross-linker monomer represented by the following Chemical Formula 1:

<Chemical Formula 1>

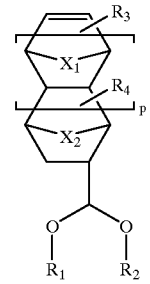

wherein $X_1$ and $X_2$ individually represent $CH_2$, $CH_2CH_2$, O or S; p is an integer from 0 to 5; $R_1$ and $R_2$ independently represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$ and $R_4$ independently represent hydrogen or methyl.

The cross-linkers of the present invention may comprise a cross-linker monomer represented by the above Chemical Formula 1; a homopolymer thereof; or a copolymer thereof.

Preferably, the cross-linker is a copolymer of (i) the compound represented by Chemical Formula 1 as a first comonomer and (ii) maleic anhydride as a second comonomer. Particularly preferred cross-linkers further comprise (iii) (meth)acrylic acid as a third comonomer and the resulting copolymer is represented by the following Chemical Formula 6.

<Chemical Formula 6>

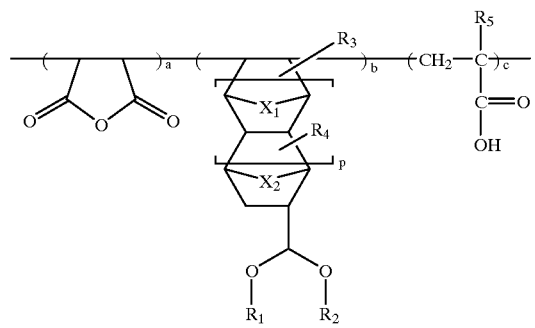

wherein, $X_1$ and $X_2$ individually represent $CH_2$, $CH_2CH_2$, O or S; p is an integer from 0 to 5; $R_1$ and $R_2$ independently represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$, ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$, $R_4$ and $R_5$ independently represent hydrogen or methyl; and a, b and c individually represent the relative amounts of each comonomer.

Alternatively, preferred cross-linkers may comprise (iii) the compound of Chemical Formula 27 as a third comonomer and the resulting copolymer is represented by the following Chemical Formula 7.

<Chemical Formula 27>

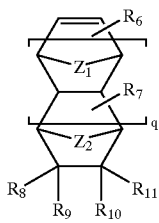

<Chemical Formula 7>

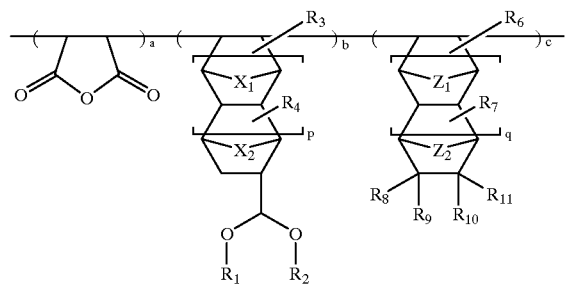

wherein, $X_1$ and $X_2$ individually represent $CH_2$, $CH_2CH_2$, O or S; $Z_1$ and $Z_2$ individually represent $CH_2$, $CH_2CH_2$, O or S; p and q individually represent an integer from 0 to 5; $R_1$, $R_2$, $R_8$, $R_9$, $R_{10}$ and $R_{11}$ independently represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$, $R_4$, $R_6$ and $R_7$ independently represent hydrogen or methyl; and a, b and c individually represent the relative amounts ratio of each comonomer.

In Chemical Formulas 6 and 7, it is preferable that the ratio a : b: c=10–89 mol %: 10–89 mol %: 1–40 mol %.

The present invention also provides a photoresist composition containing (i) a photoresist resin, (ii) a photoresist cross-linker as described above, (iii) a photoacid generator and (iv) an organic solvent.

The reaction mechanism of the cross-linkers according to the present invention is described below with reference to Reaction Scheme 1, wherein the polymer of Chemical Formula 6 is used as a cross-linker.

First, a cross-linker of the present invention is mixed with a photoresist polymer having hydroxyl groups, and the mixture is coated on a conventional semiconductor substrate (stage 1). Then, when a predetermined region of the substrate is exposed to light, the exposed portion generates acid (stage 2). Due to the acid generated from the exposed portion, the cross-linker of the present invention and the photoresist polymer combine together, and such cross-linking further generates acid, thereby carrying out continuous chain cross-linking (stage 3).

<Reaction Scheme 1>

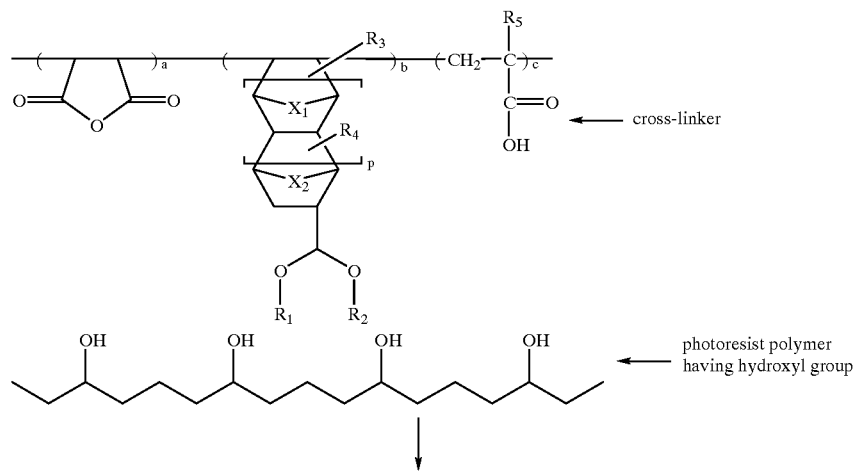

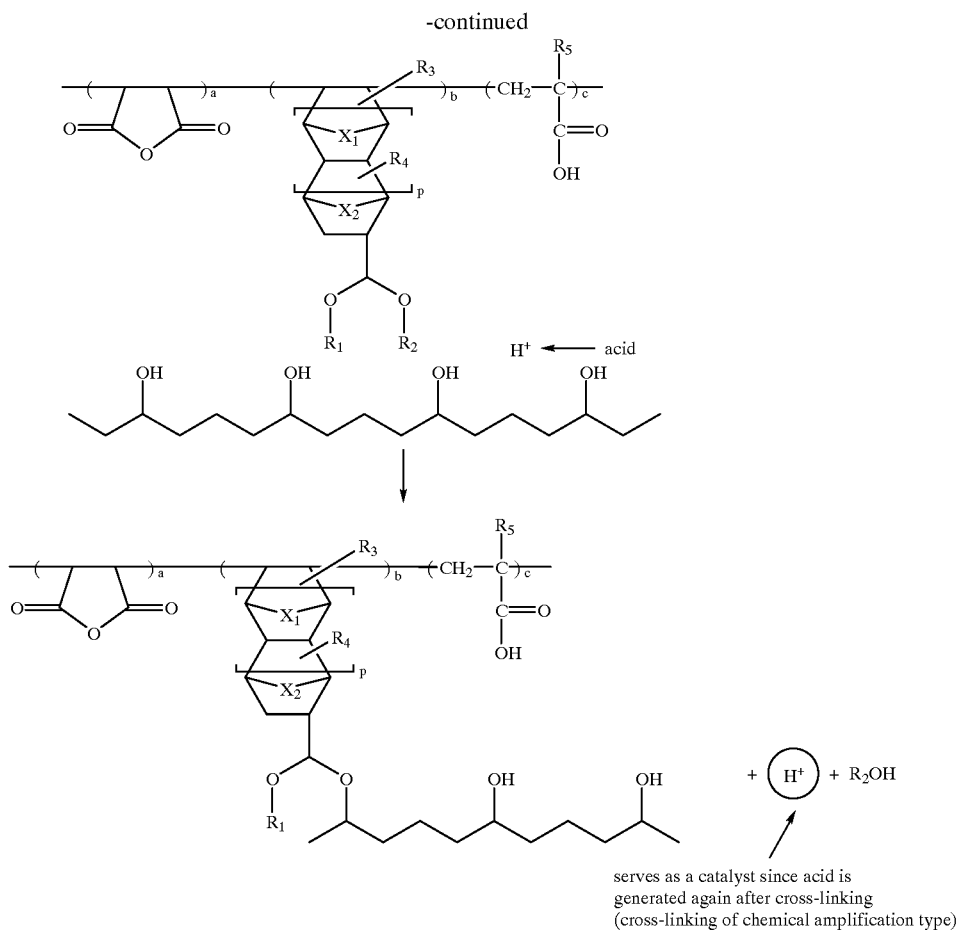

wherein, $X_1$, $X_2$, $R_1$, $R_2$, $R_3$, $R_4$ and $R_5$ are as defined in Chemical Formula 6.

PREPARATION OF CROSS-LINKER MONOMER

The inventors have discovered that compounds represented by the following Chemical Formula 1 are good negative-type photoresist cross-linker monomers.

<Chemical Formula 1>

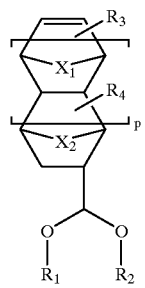

wherein $X_1$ and $X_2$ individually represent $CH_2$, $CH_2CH_2$, O or S; p is an integer from 0 to 5; $R_1$ and $R_2$ independently represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$ and $R_4$ independently represent hydrogen or methyl.

Compounds of Chemical Formula 1 react with a photoresist polymer having hydroxyl groups (—OH) in the presence of an acid to form a cross-link with the photoresist polymer. In addition, compounds of Chemical Formula 1 generate another acid as a result of the cross-linking reaction to induce a subsequent cross-linking reaction. Thus, the photoresist polymer in the exposed region can be densely hardened to obtain high resolution of the negative pattern.

The following examples demonstrate a desirable synthesizing method for photoresist cross-linker monomer according to the present invention:

EXAMPLE 1

Cyclopentadiene (70 g) and tetrahydrofuran (100 g) were put into a 1000 ml round bottom flask and stirred. Then, a solution, which comprised 95 g of acrolein (represented by following Chemical Formula 2) dissolved in 100 g of tetrahydrofuran, was dropped into the solution and cooled.

<Chemical Formula 2>

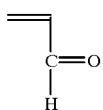

After stirring for 24 hours, solvent and non-reactant were removed from the solution using a vacuum rotary distillator. Then, suction distillation was performed to obtain a monomer represented by following Chemical Formula 3.
<Chemical Formula 3>

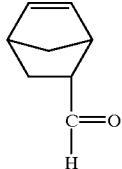

After adding trifluorosulfonic acid (1 ml) into a round bottom flask in which there were 30 g of the monomer represented by the above Chemical Formula 3 and 20 g of methanol, the resultant solution was stirred for 5 hours. Potassium hydroxide was added to adjust the pH of the resultant solution to pH 8 and then, methanol was removed therefrom using a rotary evaporator. Finally, vacuum distillation was preformed at 50° C. to obtain a monomer represented by the following Chemical Formula 4.
<Chemical Formula 4>

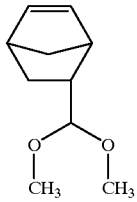

EXAMPLE 2

The procedure of Example 1 was repeated, but using ethanol instead of methanol, to obtain a monomer of the following Chemical Formula 5.
<Chemical Formula 5>

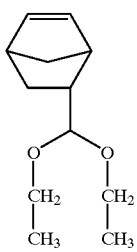

PREPARATION OF PHOTORESIST CROSS-LINKER COPOLYMER

A photoresist cross-linker monomer according to the present invention can be used as a photoresist cross-linker by itself, or it can be used to form a polymer that can also be used as a photoresist cross-linker.

Chemical Formulas 6 and 7 below represent desirable photoresist cross-linker polymers according to the present invention:
<Chemical Formula 6>

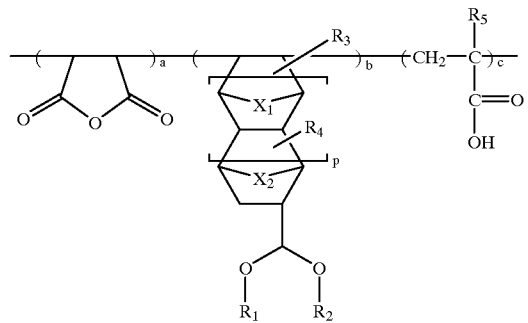

<Chemical Formula 7>

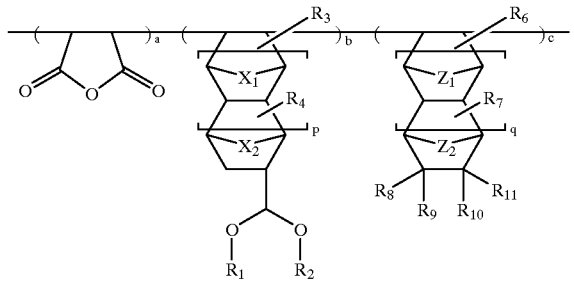

In Formulas 6 and 7, $X_1$, $X_2$, $Z_1$ and $Z_2$ individually represent $CH_2$, $CH_2CH_2$, O or S; p and q individually represent an integer from 0 to 5; $R_1$, $R_2$, $R_8$, $R_9$, $R_{10}$ and $R_{11}$ independently represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$, $R_4$, $R_5$, $R_6$ and $R_7$ independently represent hydrogen or methyl; and a, b and c individually represent the relative amount of each comonomer. Preferably, the ratio a : b: c=10–89 mol %: 10–89 mol %: 1–40 mol %.

EXAMPLE 3

(i) As a $1^{st}$ comonomer, 0.09 mole of the compound of Chemical Formula 4 obtained from Example 1, (ii) as a $2^{nd}$ comonomer, 0.1 mole of maleic anhydride represented by following Chemical Formula 8 and (iii) as a $3^{rd}$ comonomer, 0.01 mole of acrylic acid represented by following Chemical Formula 9 were put into a 200 ml of round bottom flask. After adding thereto 0.2 g of AIBN, as a polymerization initiator, and 8 g of tetrahydrofuran, as a solvent, the reactants were reacted under a nitrogen or argon atmosphere at 65° C. for 10 hours. After completion of the polymerizing reaction, the resultant solution was precipitated in ethyl ether solvent and the precipitant was vacuum dried to obtain a photoresist cross-linker copolymer of following Chemical Formula 10.

<Chemical Formula 8>

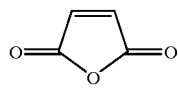

<Chemical Formula 9>

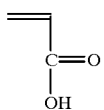

<Chemical Formula 10>

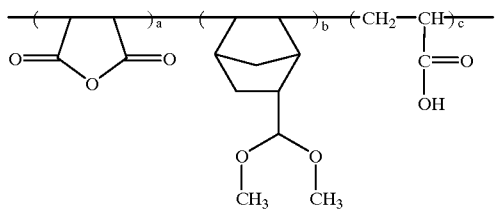

EXAMPLE 4

The procedure of Example 3 was repeated, but using the cross-linker monomer of Chemical Formula 5 obtained from Example 2 instead of the cross-linker monomer of Chemical Formula 4 obtained from Example 1, to obtain a cross-linker copolymer represented by the following Chemical Formula 11.

<Chemical Formula 11>

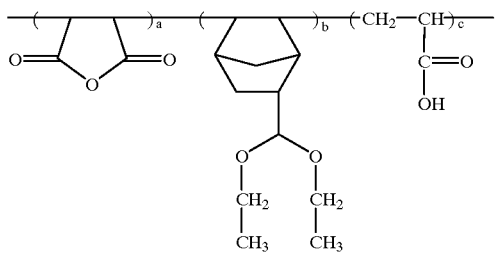

EXAMPLE 5

The procedure of Example 3 was repeated but using 5-norbornene-2-carboxylic acid (represented by the following Chemical Formula 12) instead of acrylic acid of Chemical Formula 9, to obtain a cross-linker copolymer represented by the following Chemical Formula 13.

<Chemical Formula 12>

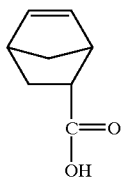

<Chemical Formula 13>

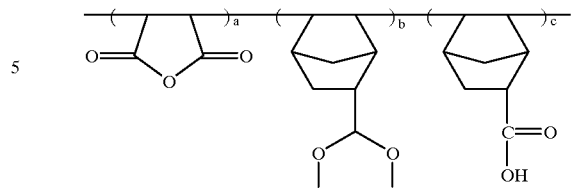

EXAMPLE 6

The procedure of Example 3 was repeated but using (i) as a first comonomer, the cross-linker monomer of Chemical Formula 5 instead of Chemical Formula 4 and, (ii) as a third comonomer, 5-norbornene-2-carboxylic acid represented by Chemical Formula 12 instead of acrylic acid of Chemical Formula 9, to obtain a cross-linker copolymer represented by the following Chemical Formula 14.

<Chemical Formula 14>

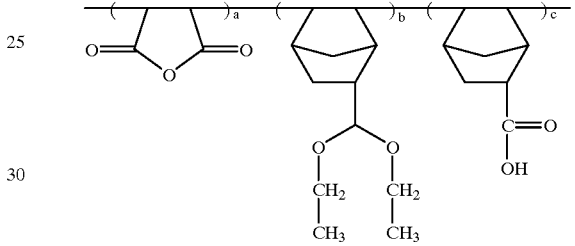

EXAMPLE 7

The procedure of Example 3 was repeated but using the compound represented by the following Chemical Formula 15 instead of acrylic acid of Chemical Formula 9 as a third comonomer, to obtain a cross-linker copolymer represented by the following Chemical Formula 16.

<Chemical Formula 15>

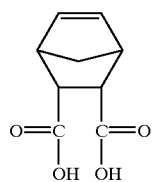

<Chemical Formula 16>

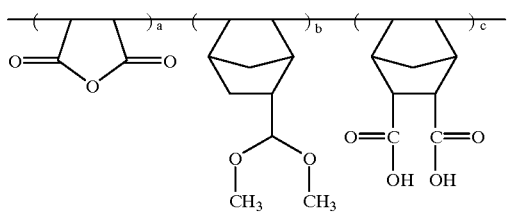

EXAMPLE 8

The procedure of Example 3 was repeated but using (i) as a first comonomer, the cross-linker monomer of Chemical Formula 5 instead of Chemical Formula 4 and, (ii) as a third comonomer, the compound represented by the above-mentioned Chemical Formula 15 instead of acrylic acid of Chemical Formula 9, to obtain a cross-linker copolymer represented by the following Chemical Formula 17.

<Chemical Formula 17>

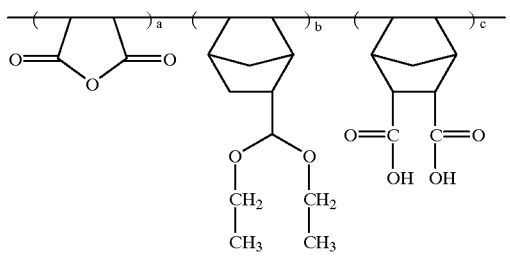

EXAMPLE 9

The procedure of Example 3 was repeated but using the compound represented by the following Chemical Formula 18 instead of acrylic acid of Chemical Formula 9 as a third comonomer, to obtain a cross-linker copolymer represented by the following Chemical Formula 19.

<Chemical Formula 18>

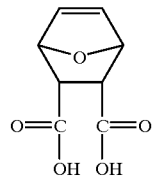

<Chemical Formula 19>

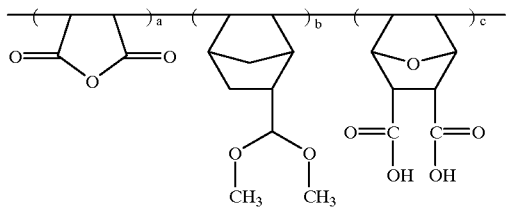

EXAMPLE 10

The procedure of Example 3 was repeated but using the compound represented by the following Chemical Formula 20 instead of acrylic acid of Chemical Formula 9 as a third comonomer, to obtain a cross-linker copolymer represented by the following, Chemical Formula 21.

<Chemical Formula 20>

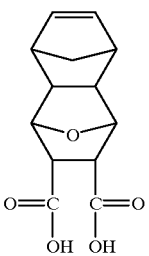

<Chemical Formula 21>

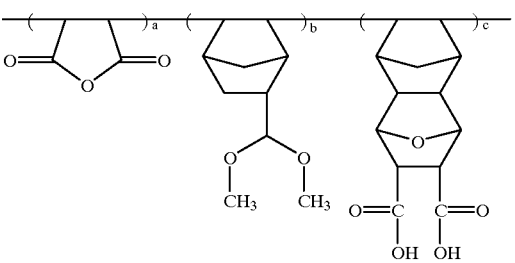

Preparation Of Photoresist Composition And Pattern Forming Process

The preparation process for a negative photoresist composition using the cross-linkers of the present invention will be described below:

Since the cross-linkers of the present invention are of the chemical amplification type, a photoresist composition of the present invention contains (i) a photoresist resin, (ii) a cross-linker according to the present invention (iii) a photoacid generator and (iv) an organic solvent for mixing them.

The above-mentioned photoresist resin may be a conventional photoresist polymer, preferably one that is suitable for use in a photolithography process employing extremely short-wavelength light (below 250 nm).

As the photoacid generator, conventional photoacid generators such as onium-type compounds, halogen-containing compounds, diazoketone compounds, sulfone, sulfonic acid and sulfonium compounds may be used, most preferably, sulfonium compounds. For example, the photoacid generator may be diphenyl iodide hexafluorophosphate, diphenyl iodide hexafluoroarsenate, diphenyliodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate or a mixture thereof.

As an organic solvent, 2-methoxyethylacetate, ethyl 3-ethoxypriopionate, methyl 3-methoxypropionate, cyclohexanone, propylene glycol methyl ether acetate, or the like may be used.

In order to form a photoresist pattern using the photoresist composition thus prepared, the photoresist composition is spin-coated on a silicon wafer, and "soft-baked" in an oven or on hot-plate, at a temperature of about 70° C. to 200° C., preferably 80° C. to 150° C., for about 1 to 5 minutes. Then, the photoresist layer is exposed to 0.1 to 100 mJ/cm² of light energy using an exposer with ArF, KrF, E-beam, EUV or X-ray radiation, and "post-baked" at a temperature of about 70° C. to 200° C., preferably 100° C. to 200° C. Then, the wafer is developed by dipping the exposed wafer into an alkaline developing solution such as 0.01–5 wt % of TMAH (tetramethylammonium hydroxide) solution, preferably 2.38 wt % or 2.5 wt % TMAH solution, for a predetermined time, preferably about 40 seconds, to obtain a ultramicro photoresist pattern.

EXAMPLE 11

First, a photoresist composition was obtained by dissolving (i) 1 g of the photoresist resin having the following Chemical Formula 22 (ii) 10 g of the photoresist cross-linker of Chemical Formula 4 obtained from Example 1 and, (iii) 0.6 g of triphenylsulfonium triflate as a photoacid generator in (iv) 66 g of 2-methoxyethyl acetate solvent.

Chemical Formula 22>

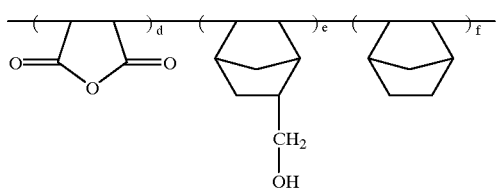

wherein d, e and f individually represent the relative amounts of each comonomer.

The photoresist composition thus prepared was spin-coated on a silicon wafer, and soft-baked at 110° for 90 seconds. After baking, the wafer was exposed using an ArF exposer, and then developed by being dipped in 2.38 wt % aqueous TMAH (tetramethylammonium hydroxide) solution for 40 seconds. Thereafter, the wafer was post-baked at 110° C. for 90 seconds to obtain a 0.13 μm L/S pattern (FIG. 1).

The results show that the hardening of the exposed region was excellent even though the exposure energy was merely 15 mJ/cm$^2$, due to the good cross-linking property of the cross-linker used.

EXAMPLE 12

Figure 2:
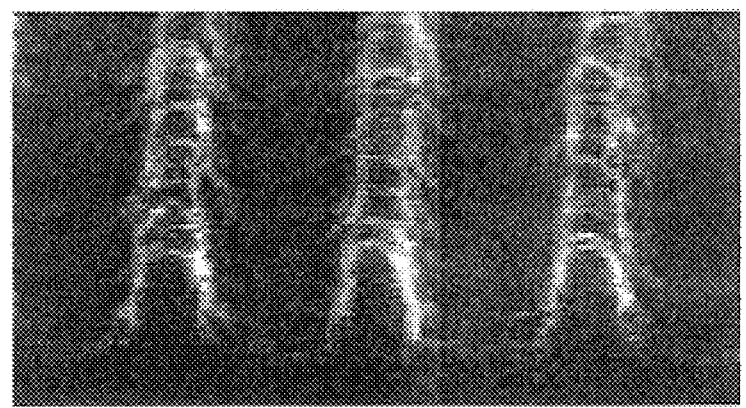

The procedure of Example 11 was repeated but using the same amount of the cross-linker of Chemical Formula 5 instead of Chemical Formula 4, to obtain a negative pattern with a resolution of 0.20 μm L/S (FIG. 2).

EXAMPLE 13

Figure 3:

The procedure of Example 11 was repeated but using (i) the compound of the following Chemical Formula 23 instead of Chemical Formula 22 as the photoresist polymer, and (ii) a compound of Chemical Formula 10 instead of Chemical Formula 4 as the cross-linker, to obtain a negative pattern with a resolution of 0.20 μm L/S (FIG. 3).

<Chemical Formula 23>

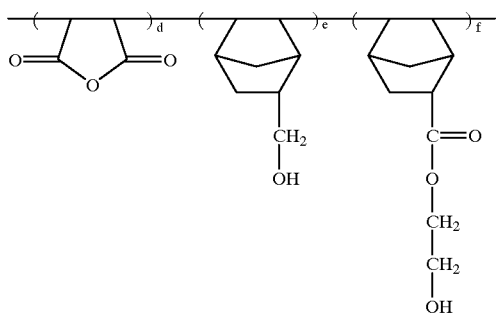

wherein d, e and f individually represent the relative amounts of each comonomer.

EXAMPLE 14

Figure 4:
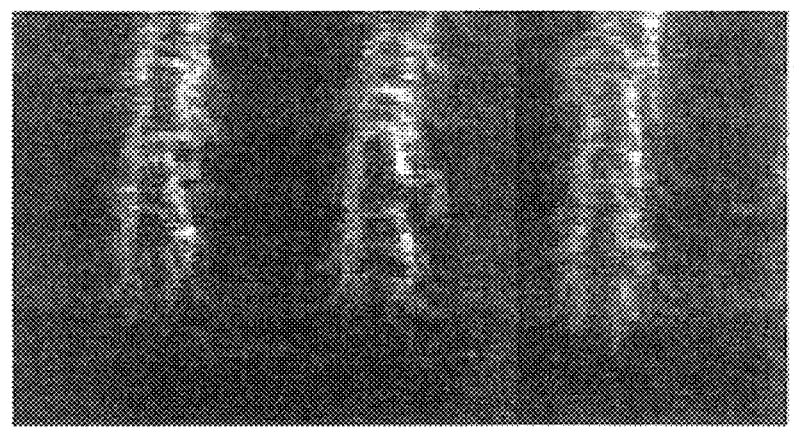

The procedure of Example 11 was repeated but using (i) the compound of the following Chemical Formula 24 instead of Chemical Formula 22 as the photoresist resin, and (ii) a compound of Chemical Formula 11 instead of Chemical Formula 4 as the cross-linker, to obtain a negative pattern with a resolution of 0.20 μm L/S (FIG. 4).

<Chemical Formula 24>

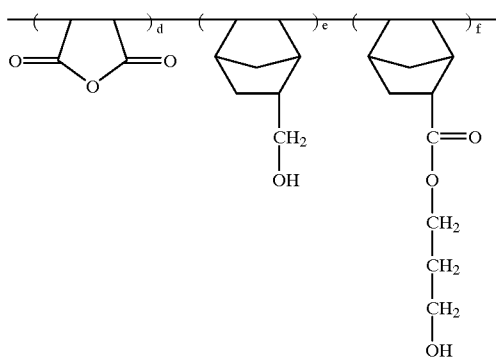

wherein d, e and f individually represent the relative amounts of each comonomer.

EXAMPLE 15

Figure 5:
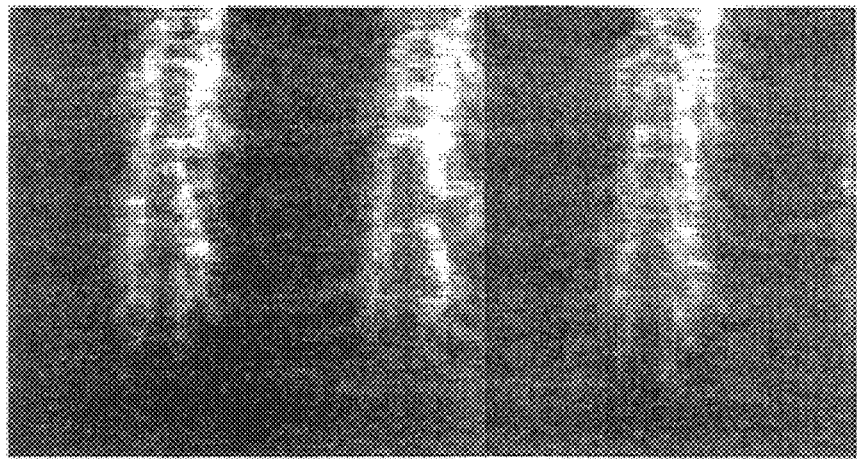

The procedure of Example 11 was repeated but using (i) the compound of the following Chemical Formula 25 instead of Chemical Formula 22 as the photoresist resin, and (ii) a compound of Chemical Formula 13 instead of Chemical Formula 4 as the cross-linker, to obtain a negative pattern with a resolution of 0.20 μm L/S (FIG. 5).

<Chemical Formula 25>

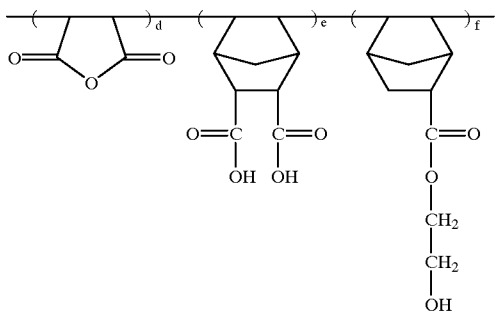

wherein d, e and f individually represent the relative amounts of each comonomer.

EXAMPLE 16

Figure 6:
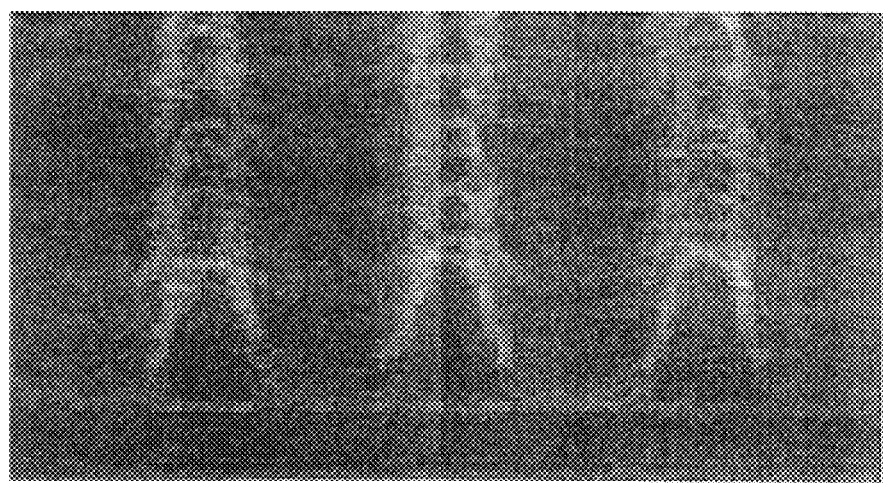

The procedure of Example 11 was repeated but using (i) the compound of the following Chemical Formula 26 instead of Chemical Formula 22 as the photoresist resin, and (ii) a compound of Chemical Formula 14 instead of Chemical Formula 4 as the cross-linker, to obtain a negative pattern with a resolution of 0.20 μm L/S (FIG. 6).

<Chemical Formula 26>

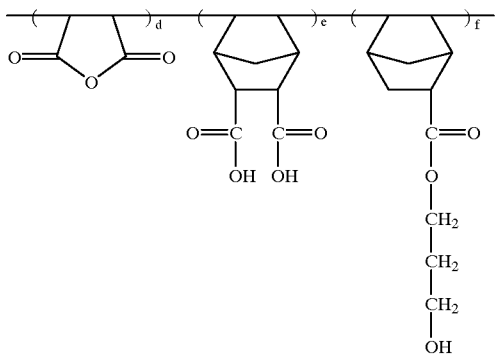

wherein d, e and f individually represent the relative amounts of each comonomer.

EXAMPLE 17

Figure 7:
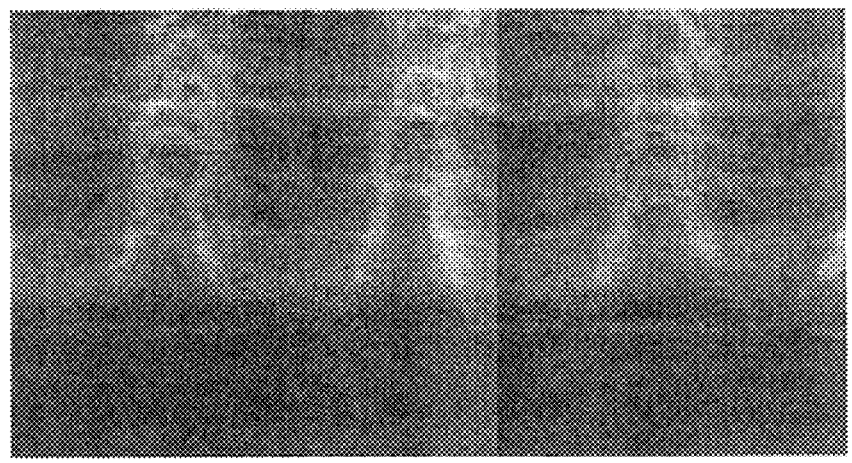

The procedure of Example 11 was repeated but using (i) the compound of Chemical Formula 24 instead of Chemical Formula 22 as the photoresist resin, and (ii) a compound of Chemical Formula 16 instead of Chemical Formula 4 as the cross-linker, to obtain a negative pattern with a resolution of 0.20 μm L/S (FIG. 7).

EXAMPLE 18

Figure 8:
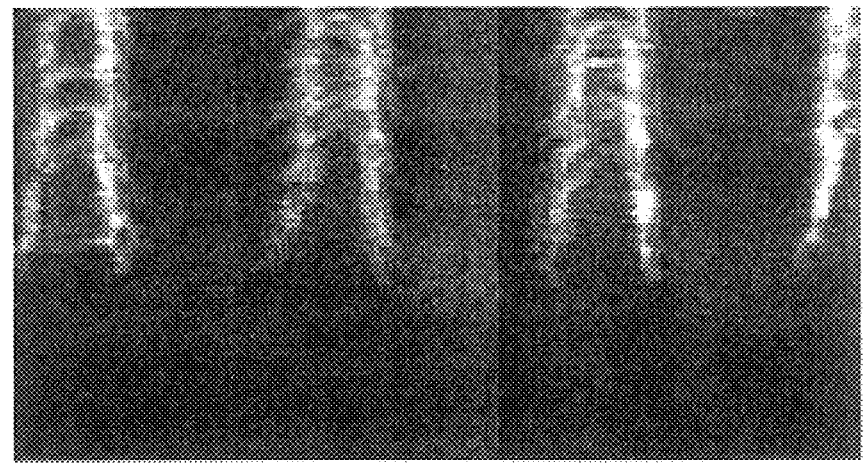

The procedure of Example 11 was repeated but using (i) the compound of Chemical Formula 24 instead of Chemical Formula 22 as the photoresist resin, and (ii) a compound of Chemical Formula 17 instead of Chemical Formula 4 as the cross-linker, to obtain a negative pattern with a resolution of 0.20 μm L/S (FIG. 8).

EXAMPLE 19

Figure 9:
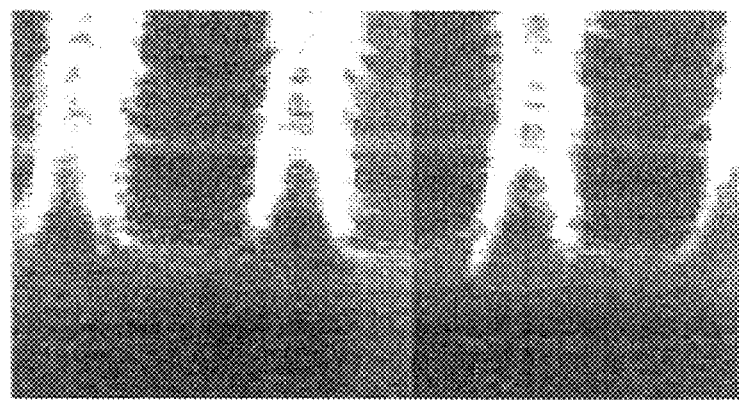

The procedure of Example 11 was repeated but using (i) the compound of Chemical Formula 24 instead of Chemical Formula 22 as the photoresist resin, and (ii) a compound of Chemical Formula 19 instead of Chemical Formula 4 as the cross-linker, to obtain a negative pattern with a resolution of 0.20 μm L/S (FIG. 9).

EXAMPLE 20

Figure 10:
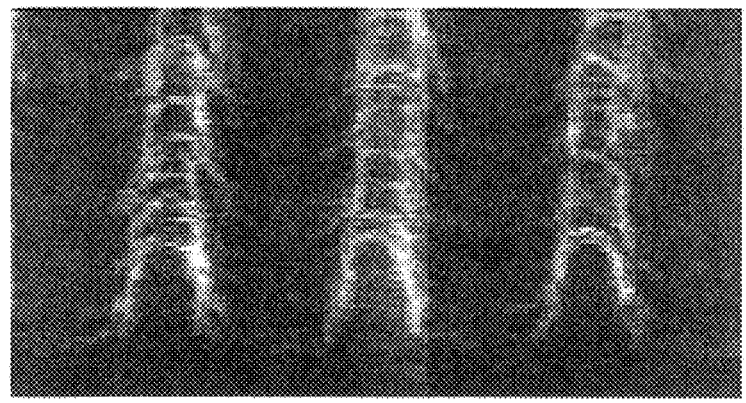

The procedure of Example 11 was repeated but using (i) the compound of Chemical Formula 24 instead of Chemical Formula 22 as the photoresist resin, and (ii) a compound of Chemical Formula 21 instead of Chemical Formula 4 as the cross-linker, to obtain a negative pattern with a resolution of 0.20 μm L/S (FIG. 10).

As described above, the photoresist cross-linker according to the present invention has high cross-linking ability. Thus, a photoresist containing the cross-linker exhibits an outstanding difference in curing between exposed regions and non-exposed regions which makes it possible to form a fine pattern with good profile. In addition, since the photoresist cross-linker is of the chemical amplification type, it is possible to obtain the desired effect using a small amount of photoacid generator, which solves the problems caused by a large amount of photoacid generator being contained in the photoresist composition. Furthermore, since the photoresist cross-linker according to the present invention has high light-sensitivity, it is possible to obtain a sufficient exposure effect with a small quantity of light radiation. Accordingly, a photoresist composition containing the cross-linker of the present invention is suitable for use in a photolithography process employing extremely short wavelength light, such as ArF (193 nm).

What is claimed is:

1. A photoresist cross-linker wherein said cross-linker is a copolymer comprising (i) a photoresist cross-linker monomer of chemical formula 1, as a $1^{st}$ comonomer:

<Chemical Formula 1>

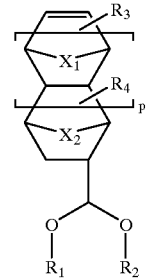

wherein $X_1$ and $X_2$ individually represent $CH_2$, $CH_2CH_2$, O or S; p is an integer from 0 to 5; $R_1$ and $R_2$ independently represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$ and $R_4$ independently represent hydrogen or methyl, and (ii) maleic anhydride as a $2^{nd}$ comonomer.

2. A photoresist cross-linker according to claim 1 wherein said copolymer further comprises (iii) acrylic acid or methacrylic acid, as a $3^{rd}$ comonomer, and is represented by following Chemical Formula 6.

<Chemical Formula 6>

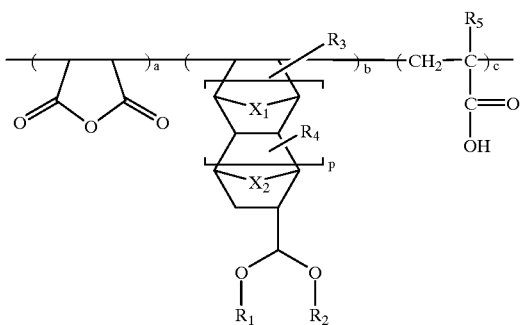

wherein $X_1$ and $X_2$ individually represent $CH_2$, $CH_2CH_2$, O or S; p is an integer of 0 to 5; $R_1$ and $R_2$ independently represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$, $R_4$ and $R_5$ independently represent hydrogen or methyl; and a, b and c individually represent the relative amounts of each comonomer.

3. A photoresist cross-linker according to claim 1 wherein said copolymer further comprises (iii) a compound represented by following Chemical formula 27, as a $3^{rd}$ comonomer:

<chemical formula 27>

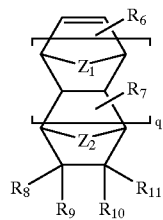

said copolymer being represented by the following Chemical Formula 7:

<Chemical Formula 7>

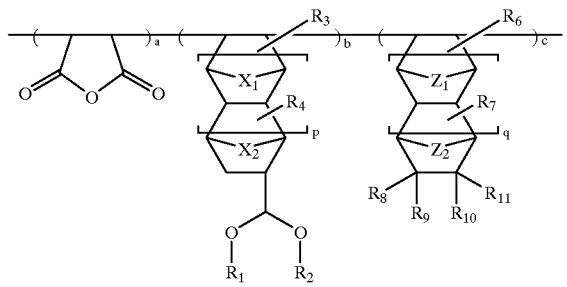

wherein $X_1$ and $X_2$ individually represent $CH_2$, $CH_2CH_2$, O or S; $Z_1$ and $Z_2$ individually represent $CH_2$, $CH_2CH_2$, O or S; p and q individually represent an integer of 0 to 5; $R_1$, $R_2$, $R_8$, $R_9$, $R_{10}$ and $R_{11}$ independently represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$, $R_4$, $R_6$ and $R_7$ independently represent hydrogen or methyl; and a, b and c individually represent the relative amounts of each comonomer.

4. A photoresist cross-linker according to claim 1, wherein the photoresist cross-linker is selected from the group consisting of the compounds represented by following Chemical Formulas 10, 11, 13, 14, 16, 17, 19 and 21.

<Chemical Formula 10>

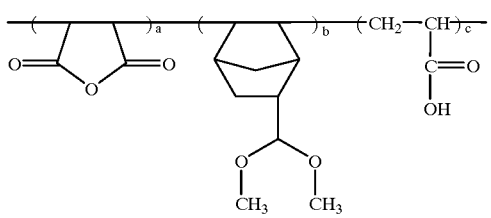

<Chemical Formula 11>

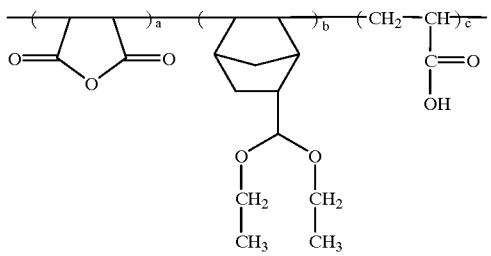

<Chemical Formula 13>

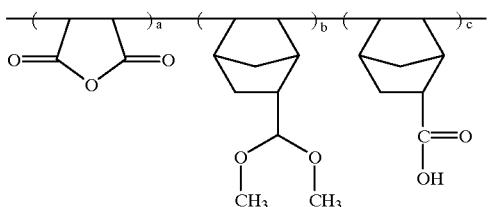

<Chemical Formula 14>

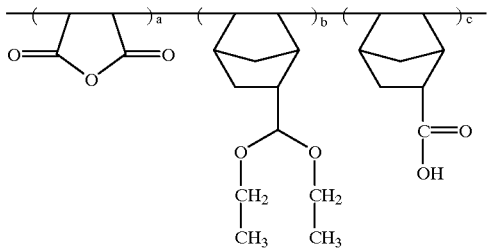

<Chemical Formula 16>

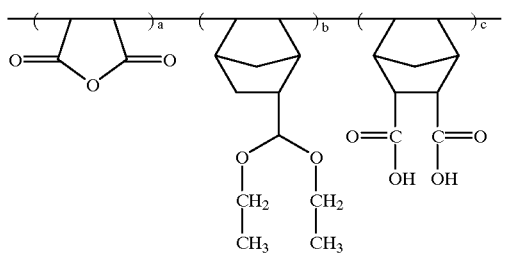

<Chemical Formula 22>

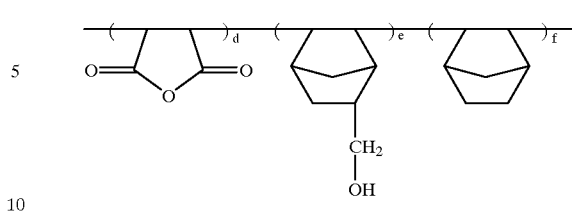

<Chemical Formula 17>

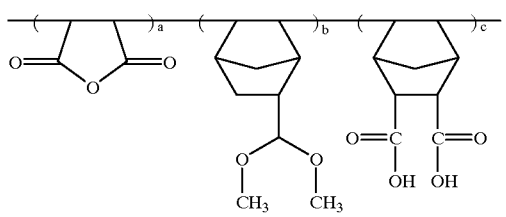

<Chemical Formula 23>

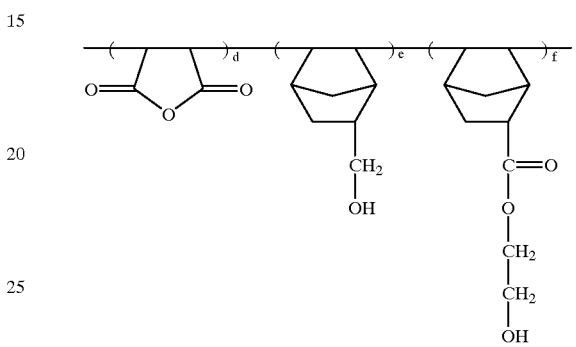

<Chemical Formula 19>

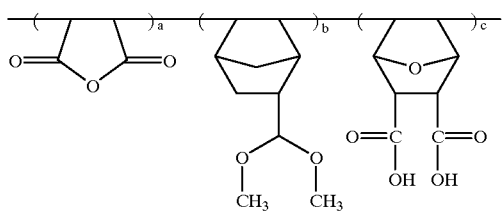

<Chemical Formula 24>

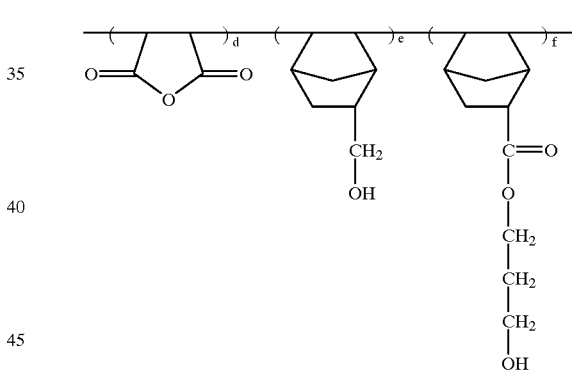

<Chemical Formula 21>

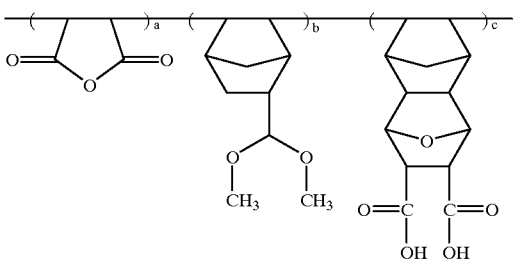

wherein a, b and c independently represent the relative amounts of each comonomer.

5. A photoresist cross-linker according to one of claims 2 to 4, wherein the ratio of a: b: c is 10–89 mol %: 10–89 mol %: 1–40 mol %.

6. A photoresist composition comprising (i) a photoresist resin, (ii) a photoresist cross-linker according to claim 1, (iii) a photoacid generator, and (iv) an organic solvent.

7. A photoresist composition according to claim 6, wherein the photoresist resin comprises a conventional photoresist polymer containing more than one hydroxyl group.

8. A photoresist composition according to claim 7, wherein the photoresist resin is selected from the group consisting of the compounds represented by following Chemical Formulas 22 to 26.

<Chemical Formula 25>

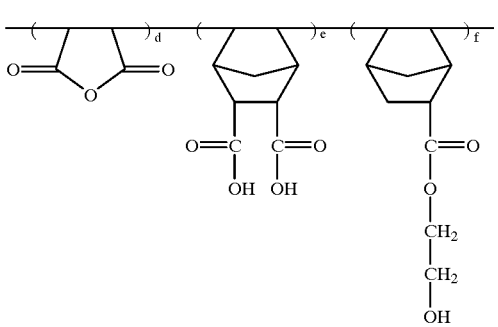

<Chemical Formula 26>

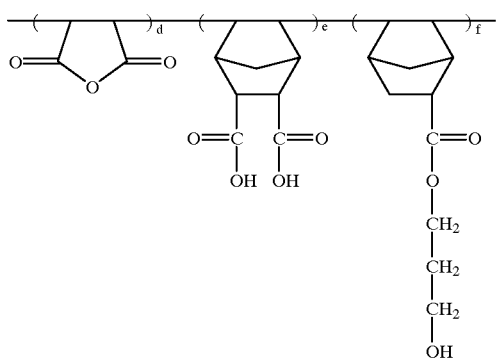

wherein d, e and f independently represent the relative amounts of each comonomer.

9. A photoresist composition according to claim 6, wherein the photoacid generator is selected from the group consisting of diphenyl iodide hexafluorophosphate, diphenyl iodide hexafluoroarsenate, diphenyliodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate and mixtures thereof.

10. A photoresist composition according to claim 6, wherein the organic solvent is selected from the group consisting of 2-methoxyethylacetate, ethyl 3-ethoxypriopionate, methyl 3-methoxypropionate, cyclohexanone, propylene glycol methyl ether acetate and mixtures thereof.

* * * * *